Jan. 14, 1969 R. D. JOYCE 3,421,961

METHOD OF MAKING HIGH DENSITY ELECTRICAL CONNECTIONS

Filed Jan. 10, 1966

INVENTOR
RICHARD D. JOYCE

BY Louis A. Kline
John J. Callahan

HIS ATTORNEYS

1

3,421,961

METHOD OF MAKING HIGH DENSITY ELECTRICAL CONNECTIONS

Richard D. Joyce, Kettering, Ohio, assignor to The National Cash Register Company, Dayton, Ohio, a corporation of Maryland Filed Jan. 10, 1966, Ser. No. 519,748

U.S. Cl. 156—296 3 Claims

Int. Cl. H05k *1/04;* H01r *5/02*

Figure 1A:
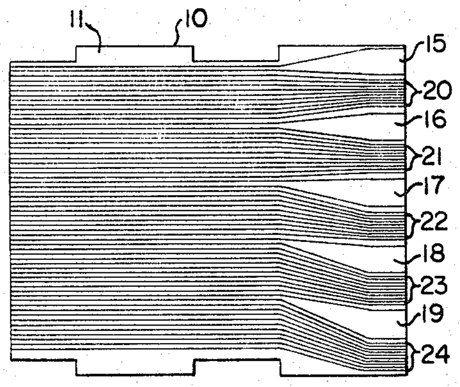

The present invention relates to a method for making high-density electrical connections with an electrically-non-conductive bonding agent.

The development and use of integrated circuit and printed circuit techniques have enabled the electrical designer to provide miniaturized electrical equipment. Such miniaturized electrical equipment may comprise components as a printed circuit card, an integrated circuit assembly, or a thermal print head, each of the components containing a large number of electrical elements. The printed circuit card may contain a large number of active and passive electrical elements necessitating the utilization of a correspondingly large number of very closely spaced printed-circuit-type terminal conductors for electrically connecting the various circuits of the card to associated electrical equipment. The integrated circuit assembly may comprise a semiconductor wafer containing a large number of regions providing active and passive devices, such as, for example, transistors of all types, capacitors, and resistors, incorporated into a large number of independent electrical circuits necessitating the utilization of a correspondingly large number of very closely spaced terminal conductors for electrically connecting the various circuits of the integrated circuit assembly to associated electrical equipment. The thermal print head, such as, for example, the head described and claimed in U.S. Patent No. 3,161,457, issued to Hans Schroeder et al. on Dec. 15, 1964, and assigned to the same assignee as the instant application, comprises a wafer of substrate material approximately one inch square and .020 inch thick. This wafer contains a number of resistive elements extending across its edge surface. The resistive elements are incorporated into a large number of independent electrical circuits, necessitating the utilization of very closely spaced electrical supply conductors for electrically connecting the various circuits of the print head to associated electrical equipment.

Heretofore, high-density electrical connections in equipment of the foregoing type were made in most cases either by fusing the conductors, as by welding, for example, or by joining the conductors with an electrically-conductive material such as, for example, solder, or by using mechanical pressure contacts such as, for example, connectors including plugs and receptacles. However, in using a fusing or joining method, there is present the requirement of very accurately registering the mating conductors, and extreme care must be exercised to prevent adjacent conductors from being electrically interconnected. In addition, the heat used in these methods may have substantial deleterious effects on the equipment unless extreme care is exercised during the making of the electrical connections. In the case of use of mechanical pressure contacts, it is both difficult and expensive to provide a connector structure of a small enough size to effect the foregoing high-density connections.

In accordance with the present invention, a method for making permanent electrical connections between a plurality of closely spaced electrical conductors carried on the surface of an electrically-non-conductive support structure and similarly spaced electrical conductors carried on the surface of another electrically-non-conductive support structure comprises the steps of applying a viscous electrically-non-conductive resin adhesive to at least one of said support structures, overlaying the electrical conductors thereon, and bringing the support structures together with pressure sufficient to cause the electrical conductors on one support structure to contact the electrical conductors on the other support structure, said resin adhesive being forced between said electrical conductors and cured to form a strong bond between said support structures retaining said electrical conductors in contact with each other.

2

Accordingly, it is an object of the invention to provide a method of making high-density electrical connections between a large number of very closely spaced electrical conductor elements, which connections are of high quality as to both their electrical and their mechanical properties, and which are effected in the absence of heat of such an amount as would be injurious to the equipment interconnected.

It is also an object of this invention to provide a method of making high-density electrical connections whereby the requirement of accurate registration of the mating conductor elements is less stringent than other methods and apparatus used to make electrical connections of this type.

Figure 1B:
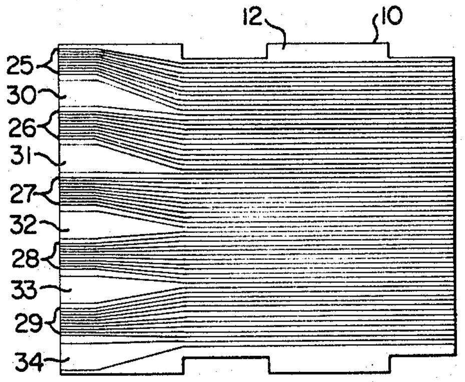
Figure 1C:
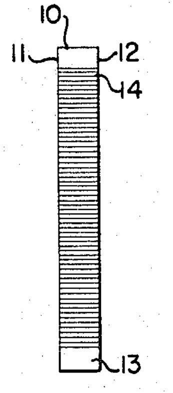
Figure 2:
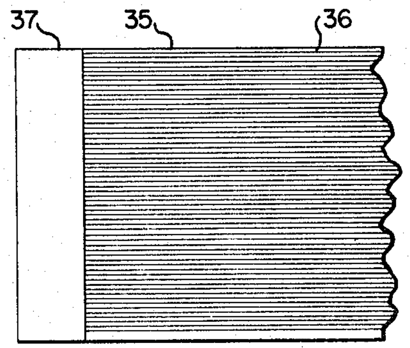
Figure 3:
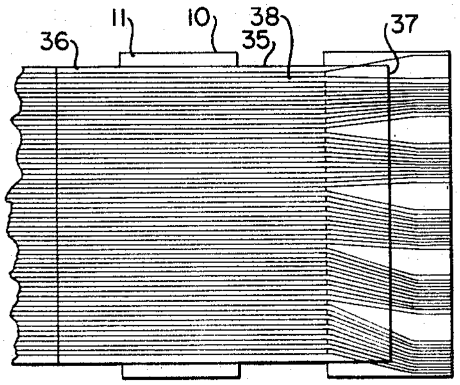
Figure 4:
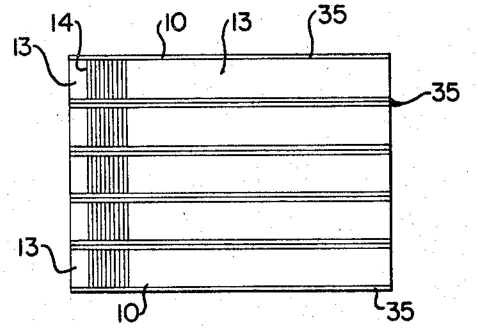

For a better understanding of the present invention, together with further objects, advantages, and features thereof, reference is made to the following description and to the accompanying drawings, which show the invention embodied in a thermal print head arrangement and in which:

FIGURE 1*a* is a top view of a thermal print head showing closely spaced electrical conductors extending along its surface to the resistive printing elements, FIGURE 1*b* is a view of the reverse side of the print head shown in FIGURE 1*a*, also showing closely spaced electrical conductors extending along its surface to the resistive printing elements, FIGURE 1*c* is an edge view of FIGURES 1*a* and 1*b* showing the edge surface, exaggerated in its width or thickness dimension for purposes of clarity, extending between the two plane surfaces and the series of spaced groups of substantially parallel resistive elements extending thereacross, FIGURE 2 is a top view of a flat cable containing closely spaced electrical conductors for supplying electrical energizing potential to the thermal print head, FIGURE 3 is a top view of the thermal print head shown in FIGURE 1*a* with its electrical conductors permanently connected with the electrical conductors of the cable shown in FIGURE 2 in accordance with the method of the present invention, and FIGURE 4 is an edge view of five of the printing units shown in FIGURES 1*a* through 1*c*, arranged in a stacked array printing head assembly, wherein the resistive elements are arranged in columns and rows to form a matrix and wherein ten cables, such as those shown in FIGURE 2, are utilized to make electrical connections with the electrical conductors on the two plane surfaces of each of the print heads.

Referring to the drawings, FIGURES 1*a*, 1*b*, and 1*c* illustrate a thermal print head of the type shown in U.S. Patent No. 3,161,457. This thermal print head is composed of a thin wafer 10 of high-resistivity substrate material having a first plane surface 11 (FIGURE 1*a*), a second plane surface 12 (FIGURE 1*b*), and an edge surface 13 (FIGURE 1*c*), extending between the two plane surfaces 11 and 12. The high-resistivity substrate material of the wafer 10 may be an insulating material such as glass, or it can be one of the semi-conductor materials such as silicon.

Extending across the edge surface 13 from the plane surface 11 to the other plane surface 12 are fifty spaced, substantially parallel resistive elements. One of the resistive elements is designated by the reference numeral 14 in FIGURES 1*c* and 4. These resistive elements may be applied to the edge surface 13 by a variety of methods such as adhesives or vacuum deposition, or by diffusion of impurities into the surface should the substrate material of the wafer 10 be of a semi-conductor material such as silicon.

Extending along the plane surface 11 of the basic thermal printing unit wafer 10 (FIGURE 1*a*) are common return circuit conductors 15 to 19, alternating with and separated by groups 20 to 24 of supply conductors. Each of the groups 20 to 24 contains five supply conductors. Similarly, extending along the opposite plane surface 12 (FIGURE 1*b*) are groups 25 to 29 of supply conductors alternating with and separated by common return conductors 30 to 34. Each of the groups 25 to 29 contains five supply conductors. Accordingly, an individual supply conductor is provided for each of the fifty resistive elements located on the edge surface 13 of the wafer 10, and a common return conductor is provided for each of the groups of supply conductors. Both the common return conductors and the supply conductors may be of any low-resistance conductive material, such as silver or copper, and may be applied to the plane surfaces 11 and 12 by use of well-known printed circuit techniques or by vacuum deposition techniques also well known in the art. Should the substrate material of the wafer 10 be one of the semi-conductor materials, such as silicon, the supply conductors and the common return conductors of metal or other low-resistivity material may be diffused into the wafer material by known techniques.

Referring now to FIGURE 2, there is shown an electrical connector 35, which is utilized to electrically connect the groups of supply conductors and the common return circuit conductors on the plane surfaces 11 and 12 of the wafer 10 to suitable energizing apparatus (not shown), such as that shown in U.S. Patent No. 3,161,457, previously referred to. Accordingly, one connector 35 is utilized to electrically connect the groups 20 to 24 of supply conductors and the common return circuit conductors 15 to 19 (FIGURE 1*a*) to energizing apparatus, while another connector 35 is used to effect a similar connection between the groups 25 to 29 of supply conductors and the common return circuit conductors 30 to 34 and the energizing apparatus. By applying a short-duration electrical pulse to any one or all of the supply conductors 20 to 24 and 25 to 29, the resulting current flow through the corresponding resistive elements (14, for example) produces therein a temperature rise of sufficient magnitude to produce a mark in the form of a dot on thermally-resistive record material located in cooperative relationship therewith.

The connector 35 comprises a flexible, transparent strip or cable of insulating material, such as Mylar, upon one surface of which are present a parallel arrangement of thirty electrical conductors, such as the conductor 36. These electrical conductors may be of copper and formed or positioned on the connector 35 by a variety of methods, such as conventional printed circuit techniques. An end portion 37 of the connector 35 is left devoid of electrical conductors to provide a tab to assist an operator in securing the electrical conductors of the connector 35 to the electrical conductors of the wafer 10.

FIGURE 3 shows the connector 35 having its electrical conductors permanently connected with the electrical supply conductors and common return circuit conductors of the wafer 10. In accordance with the present invention, the method of making the foregoing electrical connections will now be described.

A flowable non-conductive adhesive is applied by any suitable means to the plane surface 11 of the wafer 10, overlaying the electrical conductors 15 to 19 and 20 to 24 thereon. Then the connector 35 is so positioned on the plane surface 11 that the electrical conductors of the connector 35 and on the plane surface 11 are in registry along a portion of their lengths, as shown in FIGURE 3. Next, the connector 35 and the wafer 10 are brought together with pressure sufficient to cause the registered electrical conductors to contact each other. When the non-conductive adhesive thereafter cures, a permanent binder medium is formed between the connector 35 and the wafer 10, so as to maintain the registered electrical conductors in contact with each other. Any conventional support and registry means, such as a jig fixture (not shown), may be utilized to support the wafer 10 and to aid an operator in registering the electrical conductors on the wafer 10 and the connector 35 with each other. In addition, such support and registry means may incorporate both a clamp means and a heating means, with the clamp means used to bring the connector 35 and the wafer 10 together under pressure and with the heating means used to heat the adhesive, thereby hastening its curing. The binder medium holding the registered electrical conductors in contact with each other is formed primarily on the surface of the connector 35 and the wafer 10 in spaces, as at 38, between the registered electrical conductors, and, the adhesive utilized in the present invention being non-conductive, there is an absence of any electrical interference between separate electrical conductors. In addition, the electrical conductors being unpolished and thereby having surface peaks and valleys, the surface peaks of the electrical conductors, when the connector 35 and the wafer 10 are brought together under sufficient pressure, are caused to contact each other directly, and some of the flowable adhesive is forced into the valleys of the unpolished electrical conductors, providing additional bonding medium areas.

The viscous electrically-non-conductive adhesives which may be utilized in the present invention comprise epoxy resins such as, for example, those derived from bisphenol A and epichlorohydrin, in combination wtih curing agents such as, for example, the polyamides and the boron trifluoride amine catalysts. These form suitable adhesives to maintain the electrical conductors on the wafer 10 and the connector 35 in contact with each other. For example, a mixture consisting of two parts by weight of an epoxy resin sold under the trademark "Epon 828" and three parts by weight of a polyamide resin sold under the trademark "Versamid 125" provides a durable bond retaining the registered electrical conductors in contact with each other, as shown in FIGURE 3.

FIGURE 4 shows a thermal print head comprising a stacked array of five of the wafers 10. A connector 35 is used to effect electrical connection to the thirty electrical conductors provided on each of the surfaces 11 and 12 of a wafer 10. Accordingly, ten connectors 35 are used to effect electrical connection to the three hundred electrical conductors provided on the surfaces 11 and 12 of the five wafers 10 making up the printing head.

Each of the five wafers 10 has a thickness of 0.0155 inch and is approximately one inch square. The distance between individual electrical conductors provided on the surfaces 11 and 12 of the wafers 10 is 0.010 inch. Each of the connecting members 35 is 0.0023 inch thick, the Mylar strip having a 0.001-inch thickness and the copper conductors thereon having a thickness of 0.0013 inch. Accordingly, the print head shown in FIGURE 4 is one inch wide and 0.1005 inch thick, presenting a cross-sectional area of 0.1005 square inch in which the foregoing three hundred electrical conections are made. In view of the foregoing, it will be readily appreciated that the method of the present invention provides a novel and most advantageous solution to the difficult problem of making the required high-density electrical connections.

While the invention has been particularly shown and described with reference to preferred embodiments thereof, it will be understood by those skilled in the art that various changes in form and details may be made therein without departing from the spirit and scope of the invention.

What is claimed is:

1. A method of making permanent electrical connections between a plurality of closely spaced electrical conductors carried on the surface of an electrically-non-conductive support structure and similarly spaced electrical conductors carried on the surface of another electrically-non-conductive support structure, comprising the steps of applying a viscous electrically-non-conductive resin adhesive to at least one of said support structures overlaying said electrical conductors thereon, and bringing together said support structures with pressure sufficient to cause said electrical conductors on one support structure to contact said electrical conductors on said other support structure, said resin adhesive being forced between said electrical conductors and curing to form a strong bond between said support structures retaining said electrical conductors in contact with each other.

2. A method as set forth in claim 1 wherein one of said support structures is transparent.

3. A method of making permanent electrical connections between a plurality of unpolished closely spaced electrical conductors having surface peaks and valleys carried on the surface of an electrically-non-conductive support structure and similarly spaced and similar electrical conductors carried on the surface of another electrically-non-conductive support structure, comprising the steps of applying a viscous electrically-non-conductive resin adhesive to at least one of said support structures overlaying said electrical conductors thereon, and bringing together said support structures with pressure sufficient to cause said surface peaks of said electrical conductors on one support structure to contact said surface peaks on said other support structure to establish electrical connections therebetween, said resin adhesive being forced between said electrical conductors and into said valleys of said electrical conductors and curing to form a strong bond between said electrical conductors as well as said support structures maintaining said electrical connections.

References Cited

UNITED STATES PATENTS

| | | | |
|---|---|---|---|
| 2,311,704 | 2/1943 | Simison | 29—411 |
| 2,703,854 | 3/1955 | Eisler | 336—200 |
| 3,079,458 | 2/1963 | Hedstrom | 174—84 |
| 3,098,950 | 7/1963 | Geshner | 29—627 X |
| 3,168,617 | 2/1965 | Richter | 174—68.5 X |
| 3,230,163 | 1/1966 | Dreyfus | 174—68.5 X |
| 3,333,278 | 7/1967 | Hawkins et al. | 156—296 X |
| 3,348,990 | 10/1967 | Zimmerman et al. | 29—625 X |

HAROLD ANSHER, *Primary Examiner.*

U.S. Cl. X.R.

29—627, 628; 156—300, 330; 174—68.5; 346—76